(12) United States Patent  
Taguchi (10) Patent No.: US 7,319,627 B2  
(45) Date of Patent: Jan. 15, 2008

(54) MEMORY DEVICE

(75) Inventor: Kazuo Taguchi, Chino (JP)

(73) Assignee: Seiko Epson Corporation (JP)

( * ) Notice: Subject to any disclaimer, the term of this patent is extended or adjusted under 35 U.S.C. 154(b) by 21 days.

(21) Appl. No.: 11/448,521

(22) Filed: Jun. 7, 2006

(65) Prior Publication Data

US 2006/0285407 A1 Dec. 21, 2006

(30) Foreign Application Priority Data

Jun. 20, 2005 (JP) .............................. 2005-178809

(51) Int. Cl.  
*G11C 7/02* (2006.01)

(52) U.S. Cl. ...................... 365/207; 365/94; 365/104; 365/149; 365/196

(58) Field of Classification Search ............... 365/207, 365/94, 102, 104, 149, 196  
See application file for complete search history.

(56) References Cited

U.S. PATENT DOCUMENTS 5,331,590 A     7/1994   Josephson et al.  
5,394,037 A  *  2/1995   Josephson et al. ............. 327/51  
5,615,146 A  *  3/1997   Gotou .................... 365/185.01  
5,661,686 A  *  8/1997   Gotou .................... 365/185.23

* cited by examiner

*Primary Examiner*—Richard T. Elms  
*Assistant Examiner*—Toan Le  
(74) *Attorney, Agent, or Firm*—Harness, Dickey & Pierce, P.L.C.

(57) ABSTRACT

A sense amplifier circuit for a non-volatile semiconductor memory device is used to output data written in a selected non-volatile memory cell and is constructed as a current mirror circuit including a first mirror transistor and a second mirror transistor of a mirror circuit. A selection gate transistor and a detection transistor of the selected non-volatile memory cell are included as part of a load circuit connected to a drain electrode of the second mirror transistor. The detection transistor has a drain electrode linked to a source electrode of the selection gate transistor. An operating current of the selection gate transistor is smaller than an operating current of the detection transistor, and an electric current output from the second mirror transistor is determined by the operating current of the selection gate transistor. This arrangement enables determination of the stable operating current of the memory cell irrespective of the state of a floating gate of the detection transistor. Data corresponding to the writing condition of the memory cell is thus stably output from the sense amplifier circuit, based on the stable operating current of the memory cell.

4 Claims, 5 Drawing Sheets

Writing High-Level Data

Fig.2(B)

Writing Low-Level Data

Fig.4(A)

Plan View

MCO

Fig.4(B)

Sectional View Taken on Line A-A'

Insulating Film

Fig.5

MEMORY DEVICE

BACKGROUND OF THE INVENTION

1. Field of the Invention

The present invention relates to a data-rewritable non-volatile semiconductor memory device.

2. Description of the Related Art

Data-rewritable non-volatile semiconductor memory devices, for example, EEPROMs and flash ROMs, have widely been used as storage devices for various electronic apparatuses. In the non-volatile semiconductor memory device, data is rewritable by injection of electrons into a float gate of a preset MOS transistor as a one constituent of a memory cell and release of electrons from the floating gate. In a data reading operation, the operating current of the preset MOS transistor, which is based on the on-off state of the preset MOS transistor, determines the operating current of a selected memory cell. The on-off state of the preset MOS transistor is changed according to the magnitude of a potential level at the floating gate of the selected memory cell relative to a predetermined reference potential. Data corresponding to the writing condition of the memory cell is output and read from a sense amplifier circuit, based on the determined operating current of the memory cell.

In the conventional non-volatile semiconductor memory device, the state of injection of electrons into the floating gate and the state of release of electrons from the floating gate are not generally fixed but are significantly varied. This causes the varying potential level at the floating gate in the data reading operation and results in a significant variation in operating current of the memory cell.

The fluctuation range of the potential level at the floating gate relative to the predetermined reference potential, which depends upon the variation of the data writing condition, is reduced by repeated data writing and data erasing operations.

In the conventional non-volatile semiconductor memory device, the circuit structure is designed with a sufficient margin to ensure a sufficiently large operating current of the memory cell. This aims to stably read data from the memory cell even in a minimum allowable fluctuation range of the potential level at the floating gate relative to the reference potential. Such tactic of the circuit design is, however, not desirable for the optimized circuit structure.

One example of the prior art technique is disclosed in U.S. Pat. No. 5,331,590.

SUMMARY OF THE INVENTION

The object of the invention is thus to eliminate the drawbacks of the prior art technique and to provide a technique adopted in a non-volatile semiconductor memory device to determine a stable operating current of a memory cell irrespective of the state of a floating gate and to ensure stable output of data corresponding to the writing condition of the memory cell from a sense amplifier circuit based on the stable operating current of the memory cell.

In order to attain at least part of the above and the other related objects, the present invention is directed to a sense amplifier circuit for a non-volatile semiconductor memory device to output data written in a selected non-volatile memory cell.

The selected non-volatile memory cell includes: a first capacitor and a second capacitor arranged in series; a detection transistor that has a gate electrode connected to a joint terminal of the first capacitor and the second capacitor; and a selection gate transistor that has a source electrode linked to a drain electrode of the detection transistor, and a gate electrode linked to a selection signal terminal giving a corresponding selection signal.

The sense amplifier circuit is constructed as a current mirror circuit including a first mirror transistor and a second mirror transistor of a mirror circuit. The selection gate transistor and the detection transistor of the selected non-volatile memory cell are included as part of a load circuit connected to a drain electrode of the second mirror transistor. An operating current of the selection gate transistor is smaller than an operating current of the detection transistor, and an electric current output from the second mirror transistor is determined by the operating current of the selection gate transistor.

In the sense amplifier circuit of the invention, the operating current of the memory cell is determined not by the operating current of the detection transistor, which depends upon the potential level at the gate electrode of the detection transistor, but by the operating current of the selection gate transistor. The electric current output from the second mirror transistor is thus determinable by the operating current of the selection gate transistor, irrespective of a variation in potential level at the gate electrode of the detection transistor. This ensures stable output of data corresponding to the writing condition of the memory cell from the sense amplifier circuit.

In one preferable embodiment of the sense amplifier circuit of the invention, a gate insulating film of the selection gate transistor is designed to have a thickness of greater than a thickness of a gate insulating film of the detection transistor. The selection gate transistor is designed to have a gate size, which is defined by gate width/gate length, of not greater than a gate size of the detection transistor.

The sense amplifier circuit of this embodiment can readily make the operating current of the selection gate transistor smaller than the operating current of the detection transistor and make the electric current output from the second mirror transistor determinable by the operating current of the selection gate transistor.

The technique of the invention is not restricted to the sense amplifier circuit having any of the above structures but is also actualized by diversity of other applications, for example, a non-volatile semiconductor memory device including the sense amplifier circuit.

DESCRIPTION OF THE PREFERRED EMBODIMENTS

Figure 1:
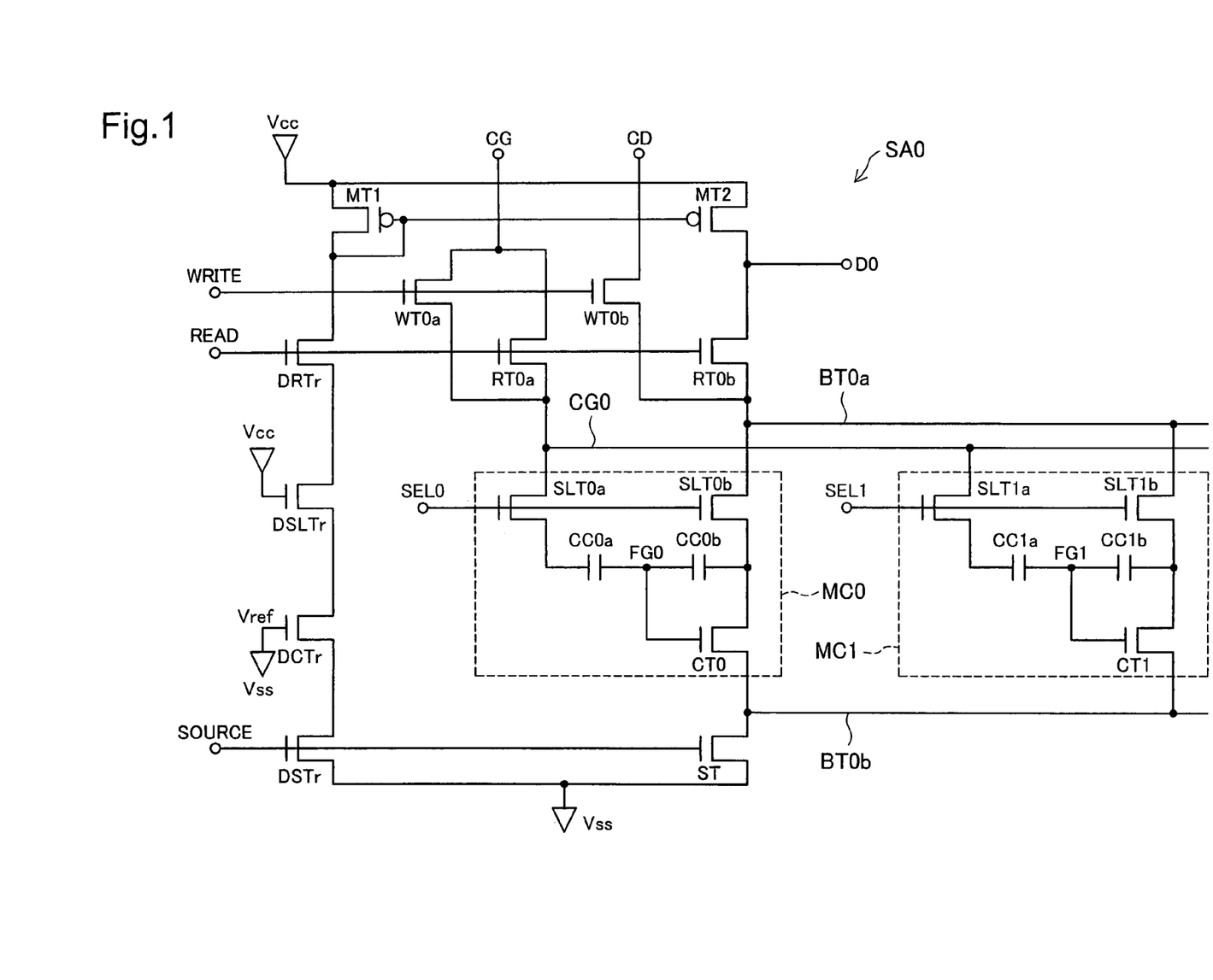
FIG. 1 schematically illustrates the structure of primary part of a non-volatile semiconductor memory device in one embodiment of the invention.

The non-volatile semiconductor memory device of the invention is described in detail with reference to a preferred embodiment in the following sequence:

A. Structure of Non-Volatile Semiconductor Memory Device
B. Data Writing Operation
C. Data Reading Operation
D. Characteristics and Effects of Embodiment
E. Modification A. Structure of Non-Volatile Semiconductor Memory Device FIG. 1 schematically illustrates the structure of primary part of a non-volatile semiconductor memory device in one embodiment of the invention. As shown in FIG. 1, a sense amplifier circuit SA0 is structured to output data, which is written in one of memory cells connected between a pair of bit lines BT0a and BT0b, from an output terminal D0. The sense amplifier circuit SA0 activates one selected memory cell as its constituent as described later. In the illustrated structure of FIG. 1, two non-volatile memory cells MC0 and MC1 are connected between the pair of bit lines BT0a and BT0b.

The two memory cells MC0 and MC1 have an identical structure. The following description thus regards only the structure of the first memory cell MC0.

The first memory cell MC0 is a non-volatile memory cell having two n-type MOS transistors SLT0a and STL0b for selection gate (hereafter simply referred to as 'selection gate transistors'), one n-type MOS transistor CT0 for detection (hereafter simply referred to as 'detection transistor'), and two capacitors CC0a and CC0b arranged in series.

A joint terminal FG0 of the two capacitors CC0a and CC0b arranged in series is linked to a gate electrode of the detection transistor CT0. Another terminal of the first capacitor CC0a opposite to the joint terminal FG0 is linked to a source electrode of the first selection gate transistor SLT0a. Another terminal of the second capacitor CC0b opposite to the joint terminal FG0 is linked to a source electrode of the second selection gate transistor SLT0b.

The first selection gate transistor SLT0a has the source electrode linked to the first capacitor CC0a, a gate electrode linked to a first selection signal terminal SEL0, and a drain electrode linked to a control signal line CG0.

The second selection gate transistor SLT0b has the source electrode linked to the second capacitor CC0b, a gate electrode linked to the first selection signal terminal SEL0, and a drain electrode linked to the first bit line BT0a.

The detection transistor CT0 has the gate electrode linked to the joint terminal FG0, a drain electrode linked to the source electrode of the second selection gate transistor SLT0b and to the second capacitor CC0b, and a source electrode linked to the second bit line BT0b. The joint terminal FG0 of the two capacitors CC0a and CC0b is connected with only the gate electrode of the detection transistor CT0, which functions as a float gate for injection and release of electrodes as described later. The gate electrode connected with the joint terminal FG0 may hereafter be referred to as 'float gate FG0'.

The second bit line BT0b linked to the source electrode of the detection transistor CT0 is also connected with a drain electrode of an n-type MOS transistor ST for source gate (hereafter simply referred to as 'source gate transistor').

The second memory cell MC1 has the identical structure with that of the first memory cell MC0 as mentioned previously.

The source gate transistor ST has the drain electrode linked to the second bit line BT0b, a gate electrode linked to a source control signal terminal SOURCE, and a source electrode linked to a first power supply terminal Vss.

There are two n-type MOS transistors RT0a and RT0b for read gate (hereafter simply referred to as 'read gate transistors') and two n-type MOS transistors WT0a and WT0b for write gate (hereafter simply referred to as 'write gate transistors'). The first bit line BT0a is connected to a source electrode of the second read gate transistor RT0b and to a source electrode of the second write gate transistor WT0b.

The control signal line CG0 is connected to a source electrode of the first read gate transistor RT0a and to a source electrode of the first write gate transistor WT0a.

The first write gate transistor WT0a has the source electrode linked to the control signal line CG0, a gate electrode linked to a write control signal terminal WRITE, and a drain electrode linked to a first control signal terminal CG.

The second write gate transistor WT0b has the source electrode linked to the first bit line BT0a, a gate electrode linked to the write control signal terminal WRITE, and a drain electrode linked to a second control signal terminal CD.

The first read gate transistor RT0a has the source electrode linked to the control signal line CG0, a gate electrode linked to a read control signal terminal READ, and a drain electrode linked to the first control signal terminal CG.

Two p-type MOS transistors MT1 and MT2 (hereafter simply referred to as 'mirror transistors') constitute a mirror circuit. The second read gate transistor RT0b has the source electrode linked to the first bit line BT0a, a gate electrode linked to the read control signal terminal READ, and a drain electrode linked to a drain electrode of the second mirror transistor MT2 and to the output terminal D0.

The second mirror transistor MT2 has the drain electrode linked to the drain electrode of the second read gate transistor RT0b and to the output terminal D0, a gate electrode linked to a gate electrode and a drain electrode of the first mirror transistor MT1, and a source electrode linked to a second power supply terminal Vcc.

The first mirror transistor MT1 has a source electrode linked to the second power supply terminal Vcc and the drain electrode and the gate electrode both linked to a drain electrode of a first n-type MOS transistor DRTr for loading (hereafter simply referred to as 'load transistor').

The first load transistor DRTr has the drain electrode linked to the drain electrode of the first mirror transistor MT1, a gate electrode linked to the read control signal terminal READ, and a source electrode linked to a drain electrode of a second load transistor DSLTr.

The second load transistor DSLTr has the drain electrode linked to the source electrode of the first load transistor DRTr, a gate electrode linked to the second power supply terminal Vcc, and a source electrode linked to a drain electrode of a third load transistor DCTr.

The third load transistor DCTr has the drain electrode linked to the source electrode of the second load transistor DSLTr, a gate electrode linked to the first power supply terminal Vss, and a source electrode linked to a drain electrode of a fourth load transistor DSTr.

The fourth load transistor DSTr has the drain electrode linked to the source electrode of the third load transistor DCTr, a gate electrode linked to the source control signal terminal SOURCE, and a source electrode linked to the first power supply terminal Vss.

The first power supply terminal Vss receives a low power supply voltage (hereafter referred to as 'power supply voltage Vss'), while the second power supply terminal Vcc receives a high power supply voltage (hereafter referred to as 'power supply voltage Vcc'). For example, the power supply voltage Vss and the power supply voltage Vcc are 0 [V] and 3 [V], respectively.

In the flow of reading data from the first memory cell MC0 as described later, the four load transistors DRTr, DSLTr, DCTr, and DSTr work as loading of the first mirror transistor MT1. The second read gate transistor RT0b, the second selection gate transistor SLT0b and the detection transistor CT0 of the first memory cell MC0, and the source gate transistor ST work as loading of the second mirror transistor MT2. Namely the two mirror transistors MT1 and MT2, the four load transistors DRTr, DSLTr, DCTr, and DSTr, the second read gate transistor RT0b, the second selection gate transistor SLT0b and the detection transistor CT0 of the first memory cell MC0, and the source gate transistor ST constitute a current mirror circuit. This current mirror circuit functions as the sense amplifier circuit SA0. The first load transistor DRTr is accordingly a load circuit equivalent to the second read gate transistor RT0b. The second load transistor DSLTr, the third load transistor DCTr, and the fourth load transistor DSTr are respectively load circuits equivalent to the second selection gate transistor SLT0b, equivalent to the detection transistor CT0, and equivalent to the source gate transistor ST. The detection transistor CT0 and the third load transistor DCTr are depletion-type MOS transistors, whereas the other transistors are enhancement-type MOS transistors.

In the current mirror circuit as the sense amplifier circuit SA0, the operating current of the first memory cell MC0 is specified by the magnitude of a potential at the float gate FG0 of the detection transistor CT0 relative to a reference voltage Vref applied to the gate electrode of the third load transistor DCTr. The flow of the operating current of the first memory cell MC0 from the second mirror transistor MT2 to the source gate transistor ST determines the potential at the output terminal D0. The operating current of the first memory cell MC0 is described in detail later.

B. Data Writing Operation

A data writing operation is described with an example of writing data into the first memory cell MC0. The procedure of writing data into the first memory cell MC0 first applies a Low-level voltage as a read control signal and a source control signal to the read control signal terminal READ and to the source control signal terminal SOURCE and applies a High-level voltage as a write control signal to the write control signal terminal WRITE, so as to disconnect the first bit line BT0a from the second mirror transistor MT2 and disconnect the second bit line BT0b from the first power supply terminal Vss. The procedure then applies the High-level voltage as a first selection signal to the first selection signal terminal SEL0 to select the first memory cell MC0, and applies preset voltages as a first control signal and a second control signal to the first control signal terminal CG and to the second control signal terminal CD to write data into the first memory cell MC0 as described below. The applied High-level voltage is substantially equal to the power supply voltage Vcc input into the second power supply terminal Vcc. The applied Low-level voltage is substantially equal to the power supply voltage Vss input into the first power supply terminal Vss.

Figure 2A:
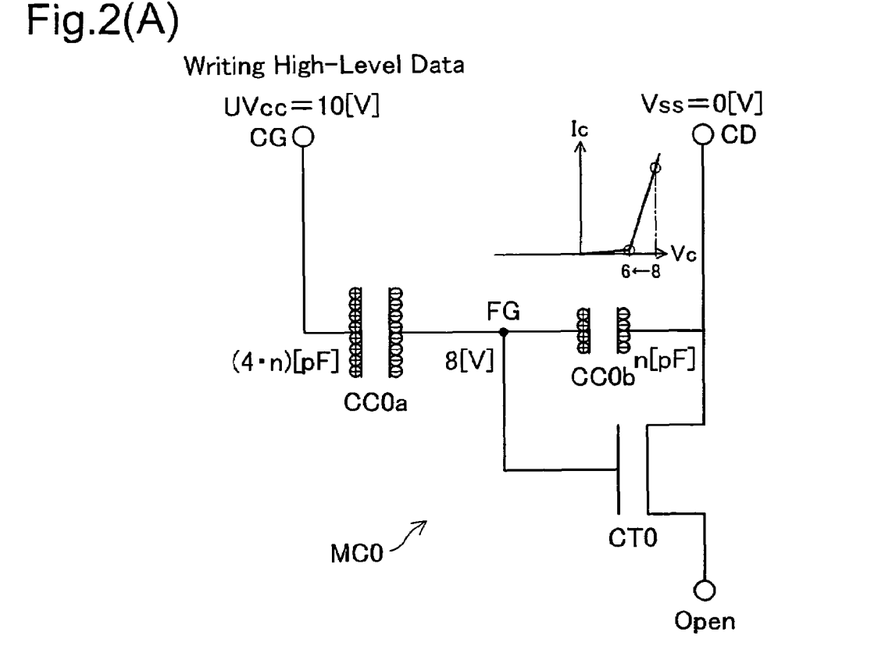
FIGS. 2(A) and 2(B) show data writing operations.
Figure 2B:
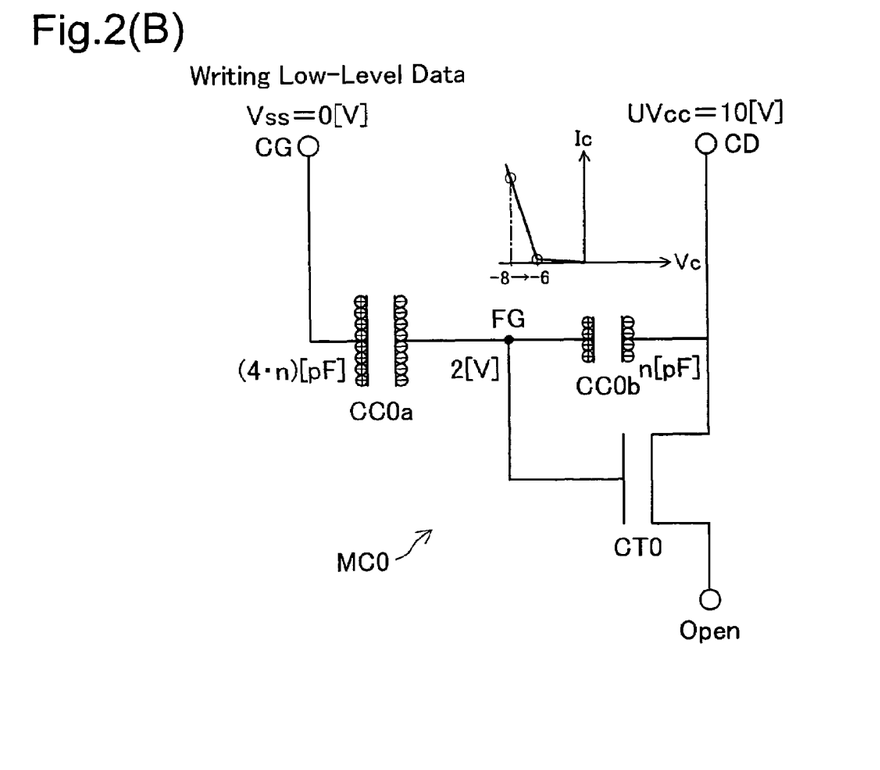

FIGS. 2(A) and 2(B) show data writing operations. FIG. 2(A) shows a High-level data writing operation, and FIG. 2(B) shows a Low-level data writing operation.

As shown in FIG. 2(A), the High-level data writing operation steps up the power supply voltage Vcc to a step-up voltage UVcc, for example, 10 [V], and applies the step-up voltage UVcc as a first control signal to the first control signal terminal CG. The High-level data writing operation, on the other hand, applies a voltage (Vss voltage) substantially equal to the power supply voltage Vss (for example, 0 [V]) as a second control signal to the second control signal terminal CD.

The High-level voltage is applied as the write control signal to the write control signal terminal WRITE (see FIG. 1) as mentioned previously and thus switches ON the first write gate transistor WT0a and the second write gate transistor WT0b. The first memory cell MC0 in this state is equivalent to a specific structure with effective connection of the second control signal terminal CD to the second capacitor CC0b, since the first control signal terminal CG is connected to the first capacitor CC0a. Application of the Low-level voltage as the source control signal to the source control signal terminal SOURCE (see FIG. 1) switches OFF the source gate transistor ST. The first memory cell MC0 in this state is equivalent to a specific structure without the detection transistor CT0, since the source electrode of the detection transistor CT0 is open.

Here it is assumed that the second capacitor CC0b has a capacitance of n [pF] and the first capacitor CC0a has a capacitance of (4·n) [pF]. In this state, the voltage at the joint terminal FG0 is equal to 8 [V] and the inter-terminal voltage of the second capacitor CC0b is equal to 8 [V]. The inter-terminal voltage of the second capacitor CC0b represents the voltage at the joint terminal FG0 relative to the terminal voltage of the second control signal terminal CD. The second capacitor CC0b has a lower voltage resistance than the applied inter-terminal voltage. The lower voltage resistance of the second capacitor CC0b causes the tunneling current and changes the inter-terminal voltage of the second capacitor CC0b to, for example, 6 [V]. This results in injection of electrons into the joint terminal FG0, that is, the float gate FG0 of the detection transistor CT0. Application of the Low-level voltage as the write control signal to the write control signal terminal WRITE disconnects the first control signal terminal CG from the first capacitor CC0a and disconnects the second control signal terminal CD from the second capacitor CC0b to maintain the charge level of the float gate FG0 attained by the injection of electrons. The High-level data is accordingly written into the first memory cell MC0.

As shown in FIG. 2(B), on the contrary to the High-level data writing operation, the Low-level data writing operation applies the Vss voltage to the first control signal terminal CG and the step-up voltage UVcc to the second control signal terminal CD.

In this state, the voltage at the joint terminal FG0 is equal to 2 [V] and the inter-terminal voltage of the second capacitor CC0b, that is, the voltage at the joint terminal FG0 relative to the terminal voltage of the second control signal terminal CD, is equal to −8 [V]. The inter-terminal voltage of the second capacitor CC0b changes to, for example, −6 [V] according to the same principle as the High-level data writing operation described above. This results in release of electrons at the float gate FG0 of the detection transistor CT0. Application of the Low-level voltage as the write control signal to the write control signal terminal WRITE disconnects the first control signal terminal CG from the first capacitor CC0a and disconnects the second control signal terminal CD from the second capacitor CC0b to maintain the charge level of the float gate FG0 attained by the release of electrons. The Low-level data is accordingly written into the first memory cell MC0.

C. Data Reading Operation

A data reading operation is described with an example of reading data from the first memory cell MC0. The procedure of reading data from the first memory cell MC0 first applies a High-level voltage as the read control signal and the source control signal to the read control signal terminal READ and to the source control signal terminal SOURCE and applies a Low-level voltage as the write control signal to the write control signal terminal WRITE, so as to connect the first bit line BT0a with the second mirror transistor MT2 and connect the second bit line BT0b with the first power supply terminal Vss (see FIG. 1). The procedure then applies the High-level voltage as the first selection signal to the first selection signal terminal SEL0 to select the first memory cell MC0, and applies the Vss voltage (0 [V]) to the first control signal terminal CG to read data from the first memory cell MC0 as described below.

Figure 3A:
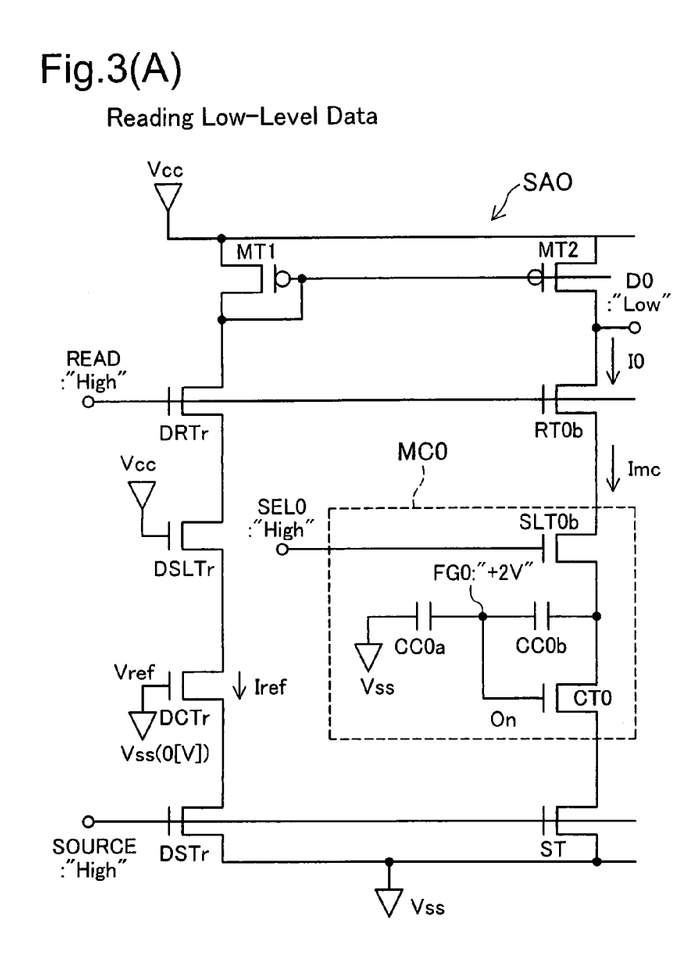
FIGS. 3(A) and 3(B) show data reading operations.
Figure 3B:
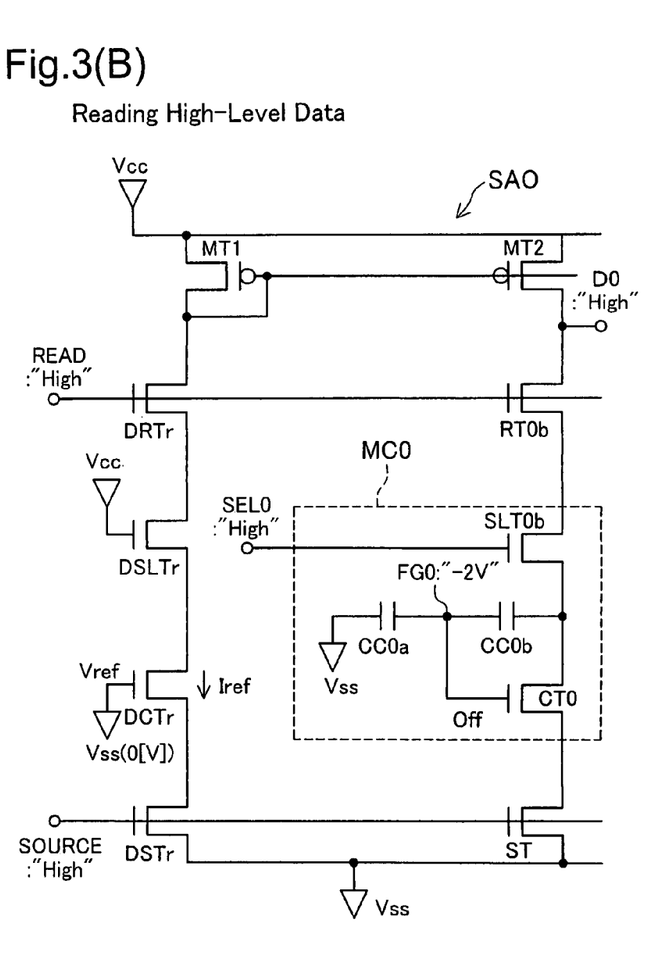

FIGS. 3(A) and 3(B) show data reading operations. FIG. 3(A) shows a Low-level data reading operation and FIG. 3(B) shows a High-level data reading operation.

The Low-level data reading operation is described with reference to FIG. 3(A).

The High-level voltage is applied as the read control signal to the read control signal terminal READ (see FIG. 1) as mentioned previously and thus switches ON the first read gate transistor RT0a and the second read gate transistor RT0b. The first memory cell MC0 in this state is equivalent to a specific structure with effective connection of the first capacitor CC0a to the first control signal terminal CG. In this specific structure, the Vss voltage (0 [V]) is applied to one terminal of the first capacitor CC0a as shown in FIG. 3(A).

As described above with reference to FIG. 2, when the Low-level data is written in the first memory cell MC0 with release of electrons from the float gate FG0, the potential at the float gate FG0 is higher than the potential (Vss voltage=0 [V]) of the reference voltage Vref applied to the gate electrode of the third load transistor DCTr.

In the illustrated example of FIG. 3(A), the potential at the float gate FG0 is equal to 2 [V]. The potential at the gate electrode of the detection transistor CT0 is sufficiently higher than the potential 0 [V] of the reference voltage Vref. The detection transistor CT0 is thus almost fully ON.

An electric current I0 output from the second mirror transistor MT2 is used as an operating current Imc of the first memory cell MC0 and is fully flowed into the source gate transistor ST via the second selection gate transistor ST0b and the detection transistor CT0 of the first memory cell MC0. The potential at the output terminal D0 is accordingly set to the Low level, and the Low-level data is read from the first memory cell MC0. The operating current Imc of the first memory cell MC0 is described in detail later.

The High-level data reading operation is described with reference to FIG. 3(B).

As described above with reference to FIG. 2, when the High-level data is written in the first memory cell MC0 with injection of electrons into the float gate FG0, the potential at the float gate FG0 is lower than the potential (Vss voltage=0 [V]) of the reference voltage Vref applied to the gate electrode of the third load transistor DCTr.

In the illustrated example of FIG. 3(B), the potential at the float gate FG0 is equal to −2 [V]. The potential at the gate electrode of the detection transistor CT0 is sufficiently lower than the potential 0 [V] of the reference voltage Vref. The detection transistor CT0 is thus almost fully OFF.

In this state, the first memory cell MC0 has no operating current Imc. All the electric current I0 output from the second mirror transistor MT2 is thus used to charge the output terminal D0. The potential at the output terminal D0 is accordingly set to the High level, and the High-level data is read from the first memory cell MC0.

D. Characteristics and Effects of Embodiment

The primary characteristic of the embodiment is the operating current Imc of the first memory cell MC0, which is equivalent to the electric current I0 output from the second mirror transistor MT2 in the Low-level data reading operation described above with reference to FIG. 3(A).

Figure 4A:
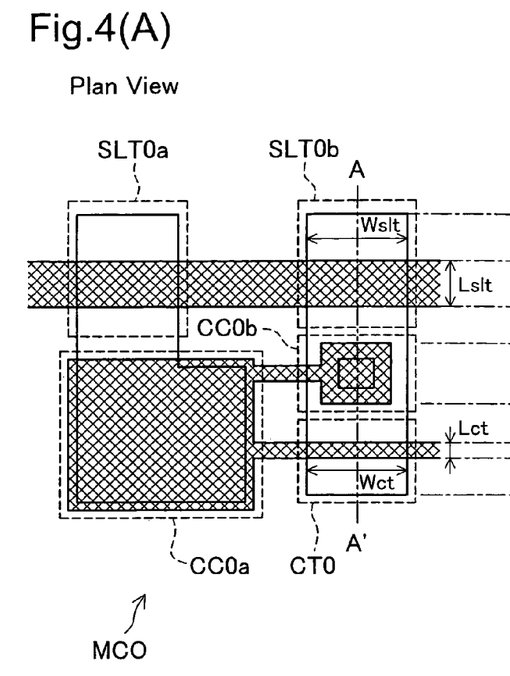
FIGS. 4(A) and 4(B) show the schematic structure of a memory cell.
Figure 4B:
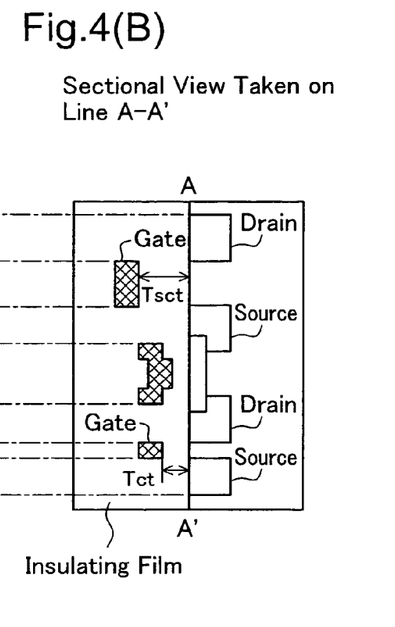

FIGS. 4(A) and 4(B) show the schematic structure of a memory cell. FIG. 4(A) is a schematic plan view of the first memory cell MC0, and FIG. 4(B) is a schematic sectional view taken on the line A-A' in the plan view of FIG. 4(A).

The second selection gate transistor SLT0b of the first memory cell MC0 has a higher voltage resistance than the detection transistor CT0, since the high voltage of 10 [V] relative to the power supply voltage of 3 [V] is applied to the drain electrode of the second selection gate transistor SLT0b in the data writing operation. A gate insulating film of the second selection gate transistor SLT0b is thus designed to have a film thickness tslt satisfying the following relation to a film thickness tct of a gate insulating film of the detection transistor CT0:

$$tslt > tct \quad (1)$$

The second selection gate transistor SLT0b is designed to have a gate size (Wslt/Lslt) (gate width (W)/gate length (L)) satisfying the following relation to a gate size (Wct/Lct) of the detection transistor CT0:

$$(Wslt/Lslt) \leq (Wct/Lct) \quad (2)$$

In the illustrated example of FIG. 4, Wslt=Wct and Lslt>Lct. The gate size (Wslt/Lslt) of the second selection gate transistor SLT0b is accordingly smaller than the gate size (Wct/Lct) of the detection transistor CT0.

Upon satisfaction of the above relations, the operating current of the second selection gate transistor SLT0b is smaller than the operating current of the detection transistor CT0. The operating current Imc of the first memory cell MC0 is thus determined by the operating current of the second selection gate transistor SLT0b. The electric current I0 output from the second mirror transistor MT2 is thus determined not by the operating current of the detection transistor CT0 but by the operating current of the second selection gate transistor SLT0b.

In a conventional structure of a non-volatile semiconductor memory device including memory cells, the gate sizes of a second selection gate transistor and a detection transistor are specified to make the operating current of the second selection gate transistor greater than the operating current of the detection transistor and determine the operating current of the memory cell by the operating current of the detection transistor.

In this conventional structure, the potential level at a float gate of the detection transistor is varied according to the data writing condition, that is, the state of injection or release of electrons into or from the float gate. The varying potential level gives a large variation in operating current of the memory cell.

In the structure of the embodiment, on the other hand, the operating current of the memory cell is determined by the operating current of the second selection gate transistor. The operating current of the memory cell is thus not affected by the variation in potential level at the float gate but is sufficiently stable with a relatively small variation. This characteristic desirably facilitates the design of the sense amplifier circuit.

Another desired semiconductor memory device has a complex structure of non-volatile memory cells and mask memory cells. This is attained by replacing part of non-volatile memory cells in a non-volatile semiconductor memory device with mask memory cells.

In general, the operating current of a mask memory cell is significantly smaller than the operating current of a non-volatile memory cell that is determined by the operating current of a detection transistor. There is accordingly much difficulty in forming the complex structure of non-volatile memory cells and mask memory cells.

In the structure of the embodiment, however, the operating current of the non-volatile memory cell is determined by the operating current of the second selection gate transistor included in the non-volatile memory cell. The use of an n-type MOS transistor, like the second selection gate transistor of the non-volatile memory cell, for the mask memory cell enables the operating current of the mask memory cell to be substantially equal to the operating current of the non-volatile memory cell.

Namely a semiconductor memory device having the complex structure of a non-volatile memory cell and a mask memory cell is attainable by replacing part of the non-volatile memory cells in the non-volatile semiconductor memory device of the embodiment with a mask memory cell.

Figure 5:
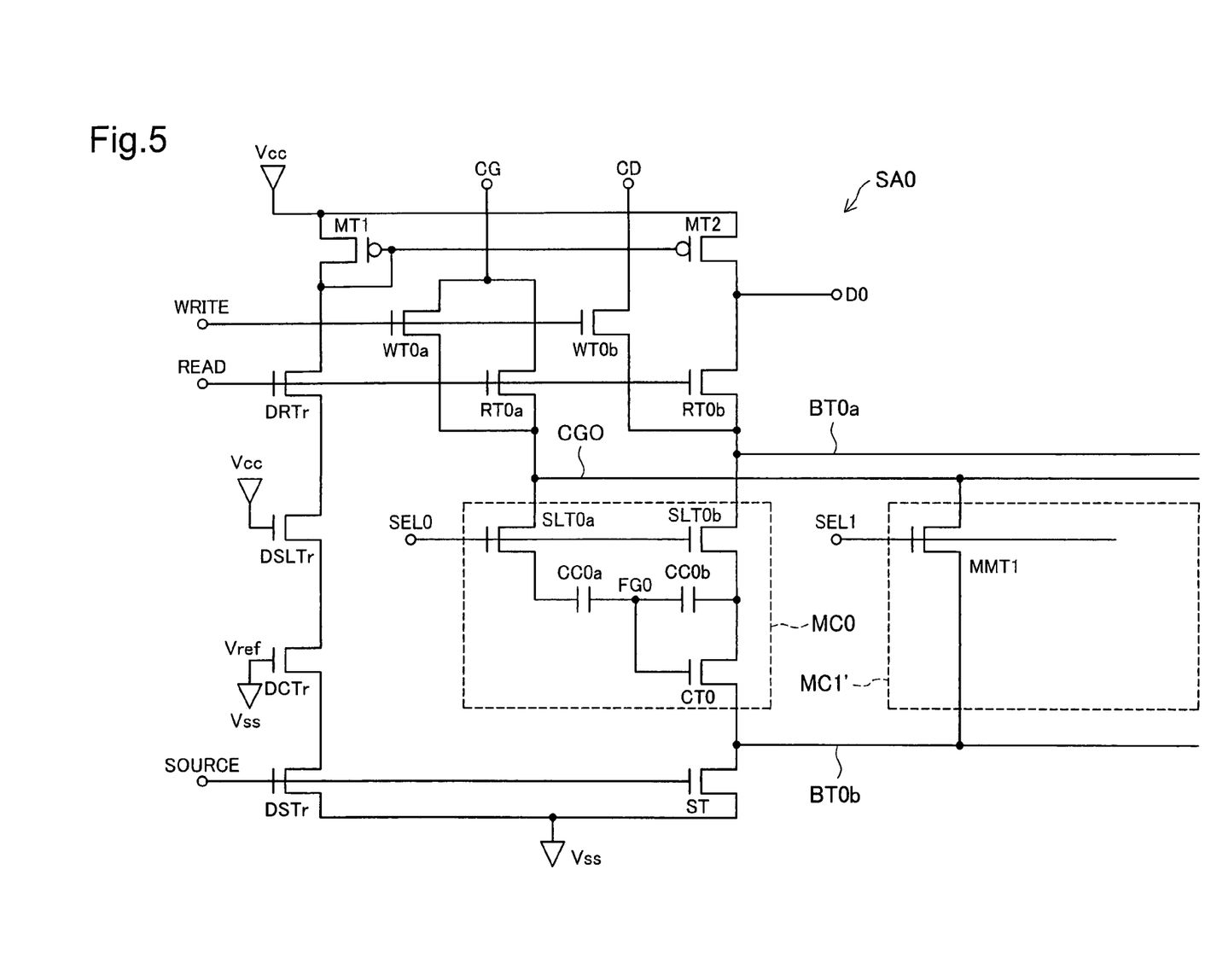
FIG. 5 shows another semiconductor memory device with replacement of a second memory cell in the structure of FIG. 1 by a mask memory cell.

FIG. 5 shows another semiconductor memory device with replacement of the second memory cell MC1 in the structure of FIG. 1 by a mask memory cell MC1'. An n-type MOS transistor MMT1 of the mask memory cell MC1' has the same characteristics as those of the second selection gate transistor SLT0b of the first memory cell MC0.

E. Modifications

The embodiment discussed above is to be considered in all aspects as illustrative and not restrictive. There may be many modifications, changes, and alterations without departing from the scope or spirit of the main characteristics of the present invention.

For the simplicity of explanation, in the structure of the embodiment, 2-bit non-volatile memory cells are connected to one bit line. This structure is, however, not restrictive but may be modified appropriately according to the data volume to be stored and the output bit width. For example, any multiple-bit non-volatile memory cells may be connected to one bit line. In another example, any multiple-bit non-volatile memory cells may be connected to each of multiple bit lines.

Finally the present application claims the priority based on Japanese Patent Application No. 2005-178809 filed on Jun. 20, 2005, which is herein incorporated by reference.

What is claimed is:

1. A sense amplifier circuit for a non-volatile semiconductor memory device to output data written in a selected non-volatile memory cell, the selected non-volatile memory cell comprising:

a first capacitor and a second capacitor arranged in series;

a detection transistor that has a gate electrode connected to a joint terminal of the first capacitor and the second capacitor; and a selection gate transistor that has a source electrode linked to a drain electrode of the detection transistor, and a gate electrode linked to a selection signal terminal giving a corresponding selection signal, the sense amplifier circuit being constructed as a current mirror circuit including a first mirror transistor and a second mirror transistor of a mirror circuit, wherein the selection gate transistor and the detection transistor of the selected non-volatile memory cell are included as part of a load circuit connected to a drain electrode of the second mirror transistor, and an operating current of the selection gate transistor is smaller than an operating current of the detection transistor, and an electric current output from the second mirror transistor is determined by the operating current of the selection gate transistor.

2. A sense amplifier circuit in accordance with claim 1, wherein a gate insulating film of the selection gate transistor is designed to have a thickness of greater than a thickness of a gate insulating film of the detection transistor, and the selection gate transistor is designed to have a gate size, which is defined by gate width/gate length, of not greater than a gate size of the detection transistor.

3. A non-volatile semiconductor memory device comprising a sense amplifier circuit in accordance with claim 1.

4. A non-volatile semiconductor memory device comprising a sense amplifier circuit in accordance with claim 2.

* * * * *